United States Patent
Shintani et al.

(10) Patent No.: US 11,713,963 B2
(45) Date of Patent: Aug. 1, 2023

(54) PATTERN SHAPE EVALUATION DEVICE, PATTERN SHAPE EVALUATION SYSTEM, AND PATTERN SHAPE EVALUATION METHOD

(71) Applicant: Hitachi High-Tech Corporation, Tokyo (JP)

(72) Inventors: Atsuko Shintani, Tokyo (JP); Takahiro Kawasaki, Tokyo (JP); Kazuhisa Hasumi, Tokyo (JP); Masami Ikota, Tokyo (JP); Hiroki Kawada, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 234 days.

(21) Appl. No.: 17/277,395

(22) PCT Filed: May 29, 2019

(86) PCT No.: PCT/JP2019/021368
§ 371 (c)(1),
(2) Date: Mar. 18, 2021

(87) PCT Pub. No.: WO2020/066128
PCT Pub. Date: Apr. 2, 2020

(65) Prior Publication Data
US 2022/0034653 A1    Feb. 3, 2022

(30) Foreign Application Priority Data
Sep. 25, 2018  (JP) .................. 2018-178430

(51) Int. Cl.
*G01B 15/04*    (2006.01)
*G01B 15/08*    (2006.01)
(Continued)

(52) U.S. Cl.
CPC ............ *G01B 15/04* (2013.01); *G01B 15/08* (2013.01); *G01N 23/2251* (2013.01); *H01J 37/28* (2013.01); *H01J 2237/2817* (2013.01)

(58) Field of Classification Search
CPC .... G01B 15/04; G01B 15/08; G01N 23/2251; G01N 21/956; H01J 37/00; H01J 37/02;
(Continued)

(56) References Cited

U.S. PATENT DOCUMENTS

| | | |
|---|---|---|
| 7,053,371 B2 | 5/2006 | Ojima |
| 7,095,884 B2 | 8/2006 | Yamaguchi |

(Continued)

FOREIGN PATENT DOCUMENTS

| | | |
|---|---|---|
| JP | 2003037139 A | 2/2003 |
| JP | 2005283139 A | 10/2005 |

(Continued)

OTHER PUBLICATIONS

Villarrubia et al. "Unbiased estimation of linewidth roughness" Proceedings of SPIE, 2005, vol. 5752, pp. 480-488.
(Continued)

*Primary Examiner* — Jason L McCormack
(74) *Attorney, Agent, or Firm* — Miles & Stockbridge, P.C.

(57) ABSTRACT

Line-edge roughness or line width roughness is evaluated while preventing influence of noise caused by a device or an environment. Therefore, an averaged signal profile 405 in which a moving average of S pixels (S is an integer greater than 1) is taken in a Y direction is obtained from a signal profile showing a secondary electron signal amount distribution in an X direction with respect to a predetermined Y coordinate obtained from a top-down image, an edge position 406 of a line pattern is extracted based on the averaged signal profile, and a noise floor height is calculated based on (Continued)

a first power spectral density 407 of LER data or LWR data based on the extracted edge position and a second power spectral density 409 of a rectangular window function corresponding to the moving average of the S pixels.

<p align="center">16 Claims, 11 Drawing Sheets</p>

(51) Int. Cl.
     *G01N 23/2251*     (2018.01)
     *H01J 37/28*     (2006.01)

(58) Field of Classification Search
     CPC .......... H01J 37/26; H01J 37/28; H01J 37/222; H01J 2237/2817; G06T 2207/10061; G06T 220/30148; G06T 7/0006; G06T 7/13
     USPC .......................................... 250/306, 307, 311
     See application file for complete search history.

(56) References Cited

U.S. PATENT DOCUMENTS

| | | |
|---|---|---|
| 7,366,620 B2 | 4/2008 | Yamaguchi |
| 2003/0021463 A1 | 1/2003 | Yamaguchi et al. |
| 2005/0211897 A1 | 9/2005 | Sasajima et al. |
| 2006/0036409 A1 | 2/2006 | Yamaguchi et al. |
| 2006/0145076 A1 | 7/2006 | Yamaguchi et al. |
| 2008/0159630 A1* | 7/2008 | Sharon ............... G06T 7/13 382/199 |
| 2008/0194046 A1 | 8/2008 | Ma et al. |
| 2009/0226096 A1* | 9/2009 | Namai ............ G06V 10/443 382/199 |
| 2014/0264016 A1* | 9/2014 | Chen ................ H01J 37/26 250/307 |
| 2016/0123726 A1 | 5/2016 | Yamaguchi et al. |

FOREIGN PATENT DOCUMENTS

| | | |
|---|---|---|
| JP | 2006038779 A | 2/2006 |
| JP | 2006215020 A | 8/2006 |
| JP | 2014240765 A | 12/2014 |

OTHER PUBLICATIONS

Bunday et al. "Determination of Optimal Parameters for CD-SEM Measurement of Line-Edge Roughness", Proceedings of SPIE, 2004, vol. 5375, pp. 515-533.

Someya, Y. et al.; "Spin-on Carbon-Hardmask with high wiggling resistance"; Proceedings on SPIE; vol. 8325; 8325OU; (2012).

Lee, T. et al.; "Application of DBM System to overlay varication and wiggling quantification for advanced process"; Proceedings on SPIE; vol. 8324; 83241B; (2012).

* cited by examiner

[FIG. 1]
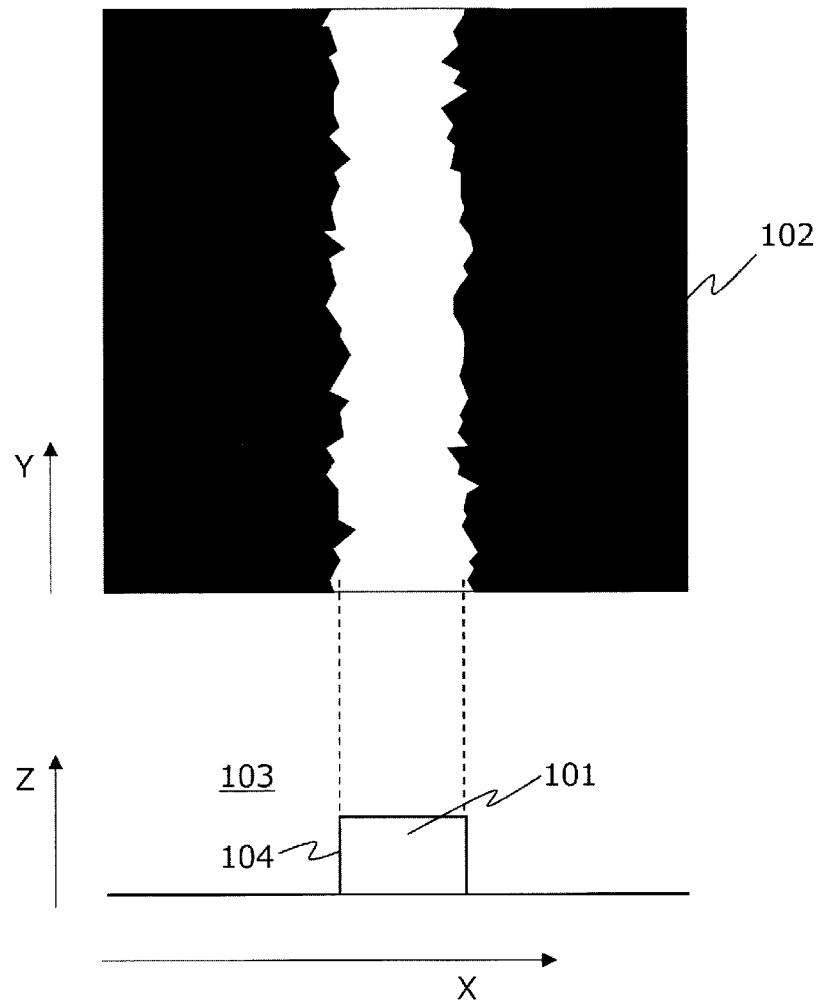

[FIG. 2]
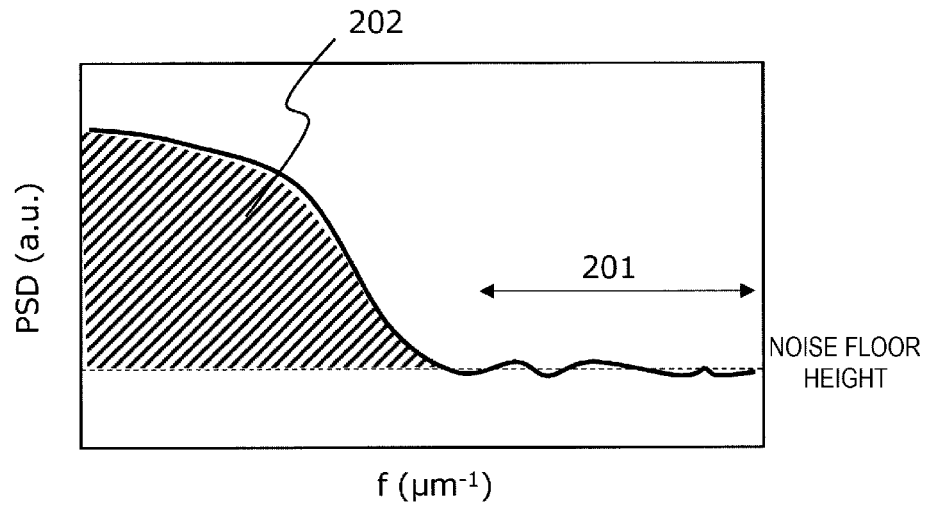
[FIG. 3]
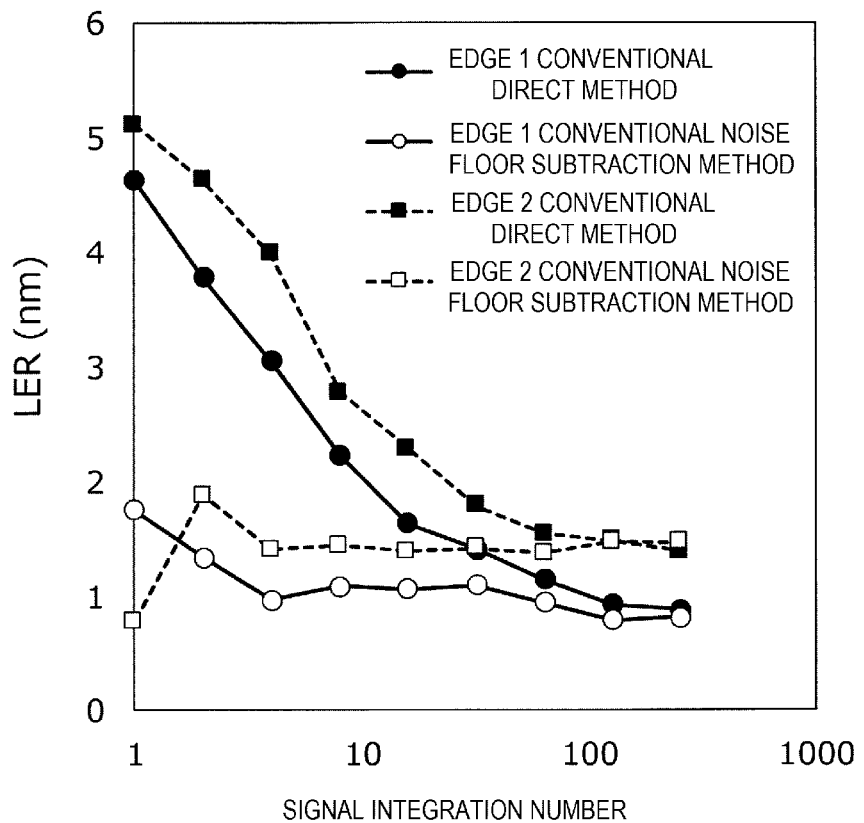

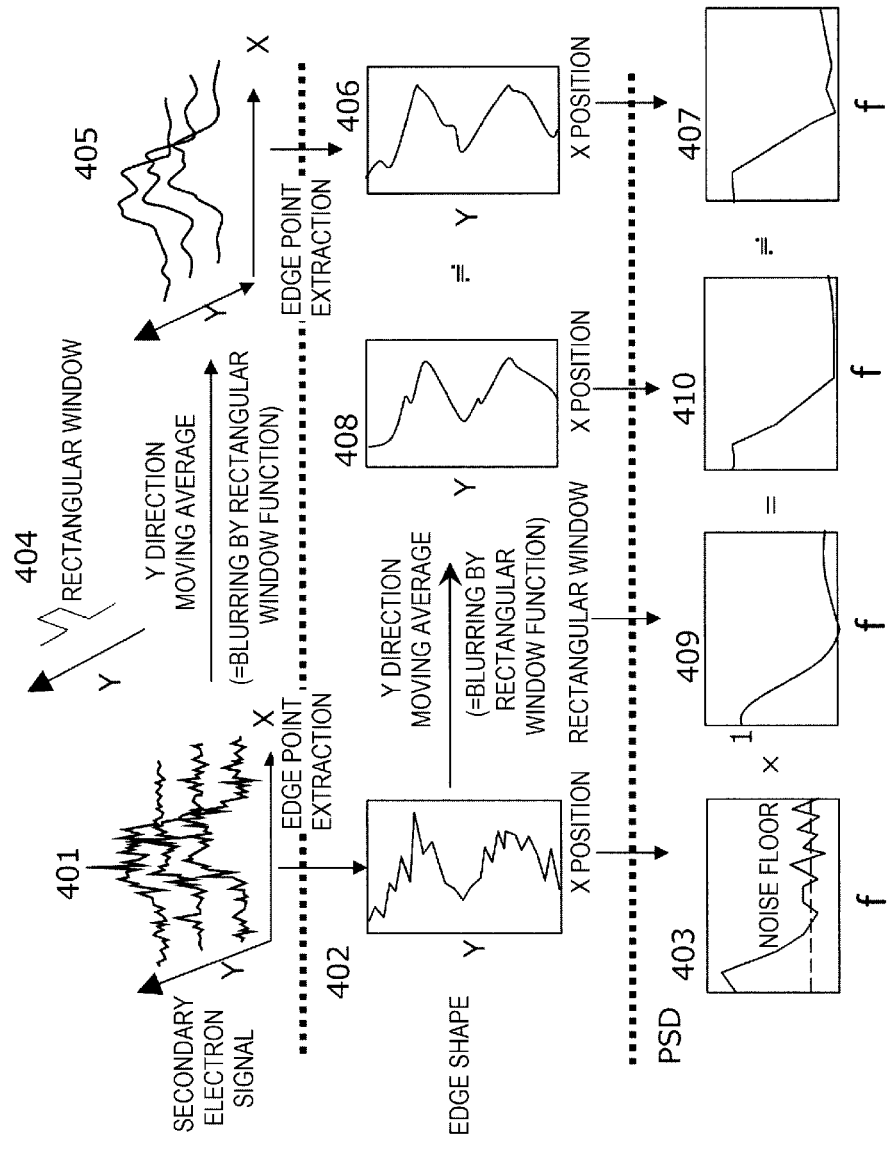
[FIG. 4]

[FIG. 5A]
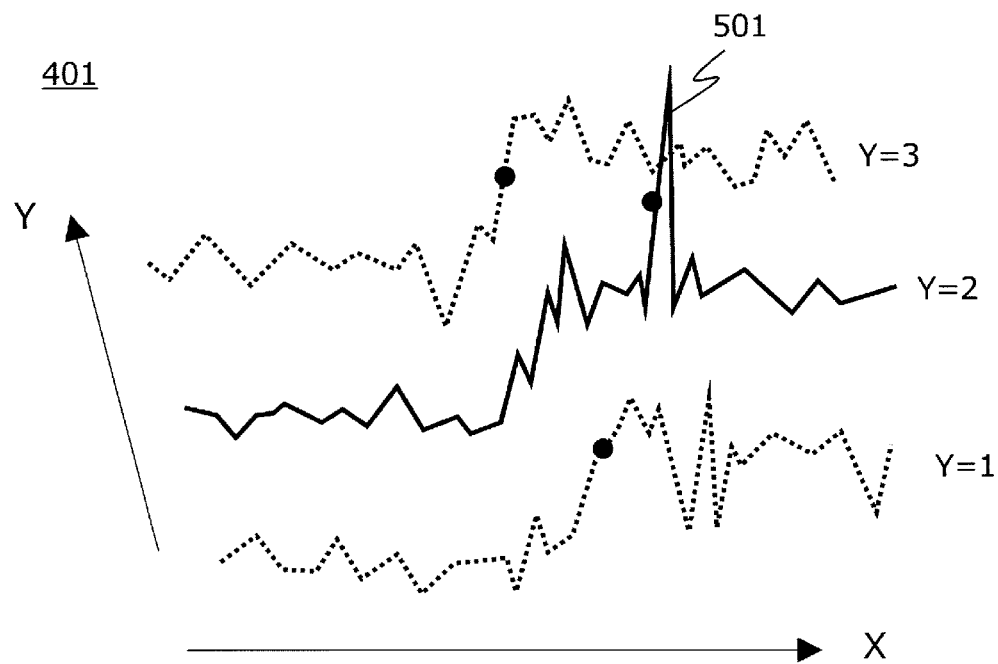
[FIG. 5B]
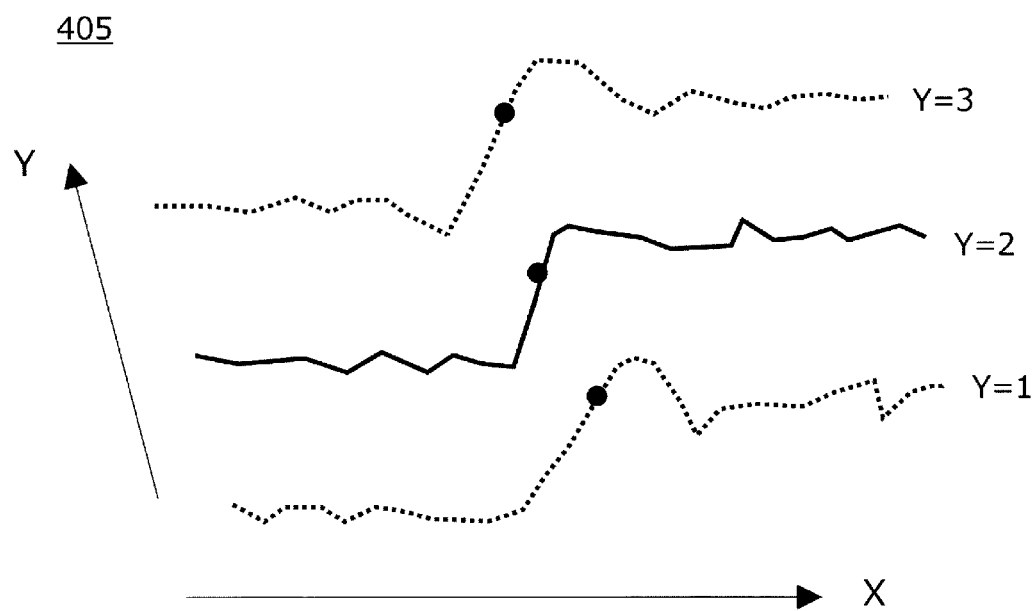

[FIG. 6]
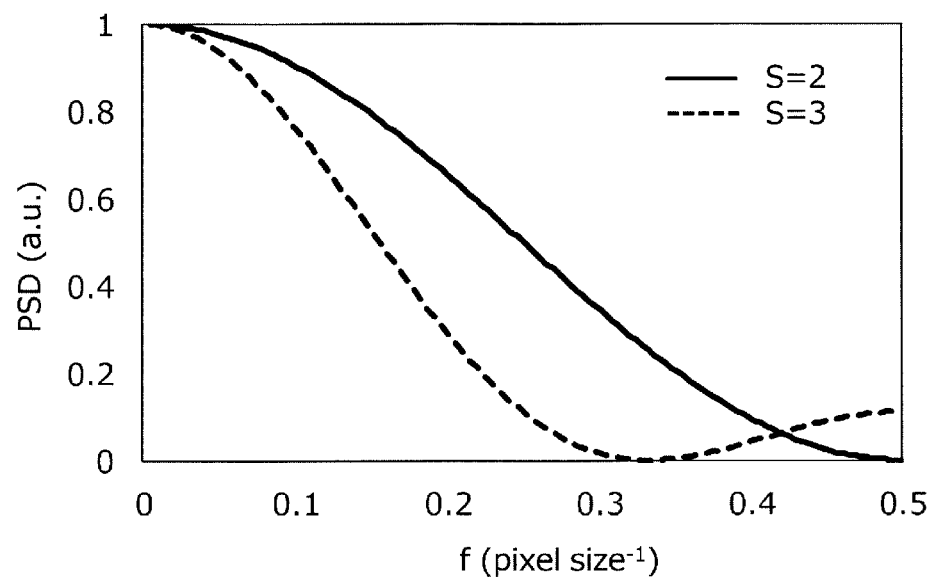
[FIG. 7]
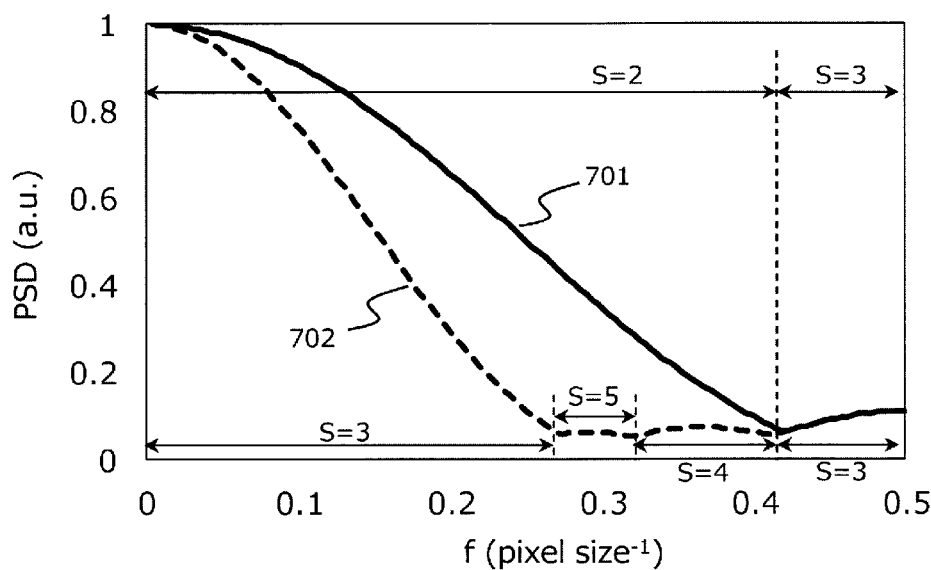

[FIG. 8]
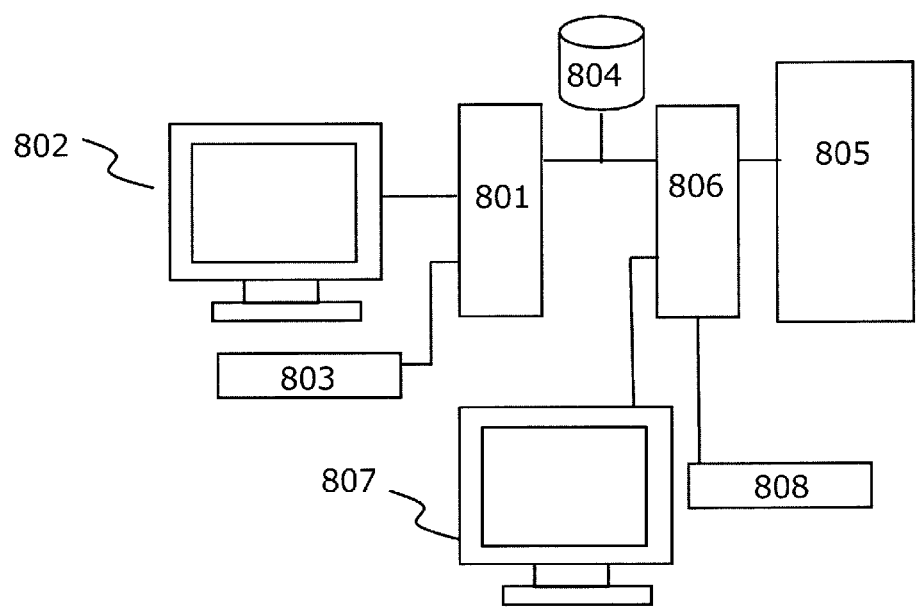

[FIG. 9]
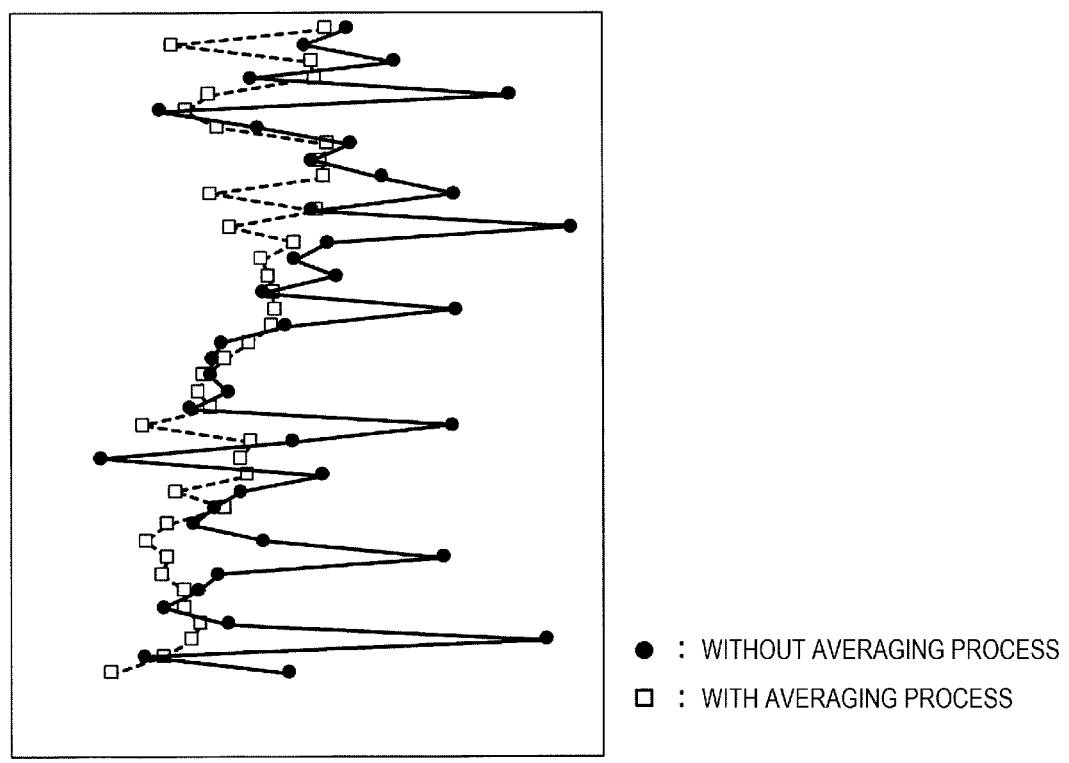

[FIG. 10]
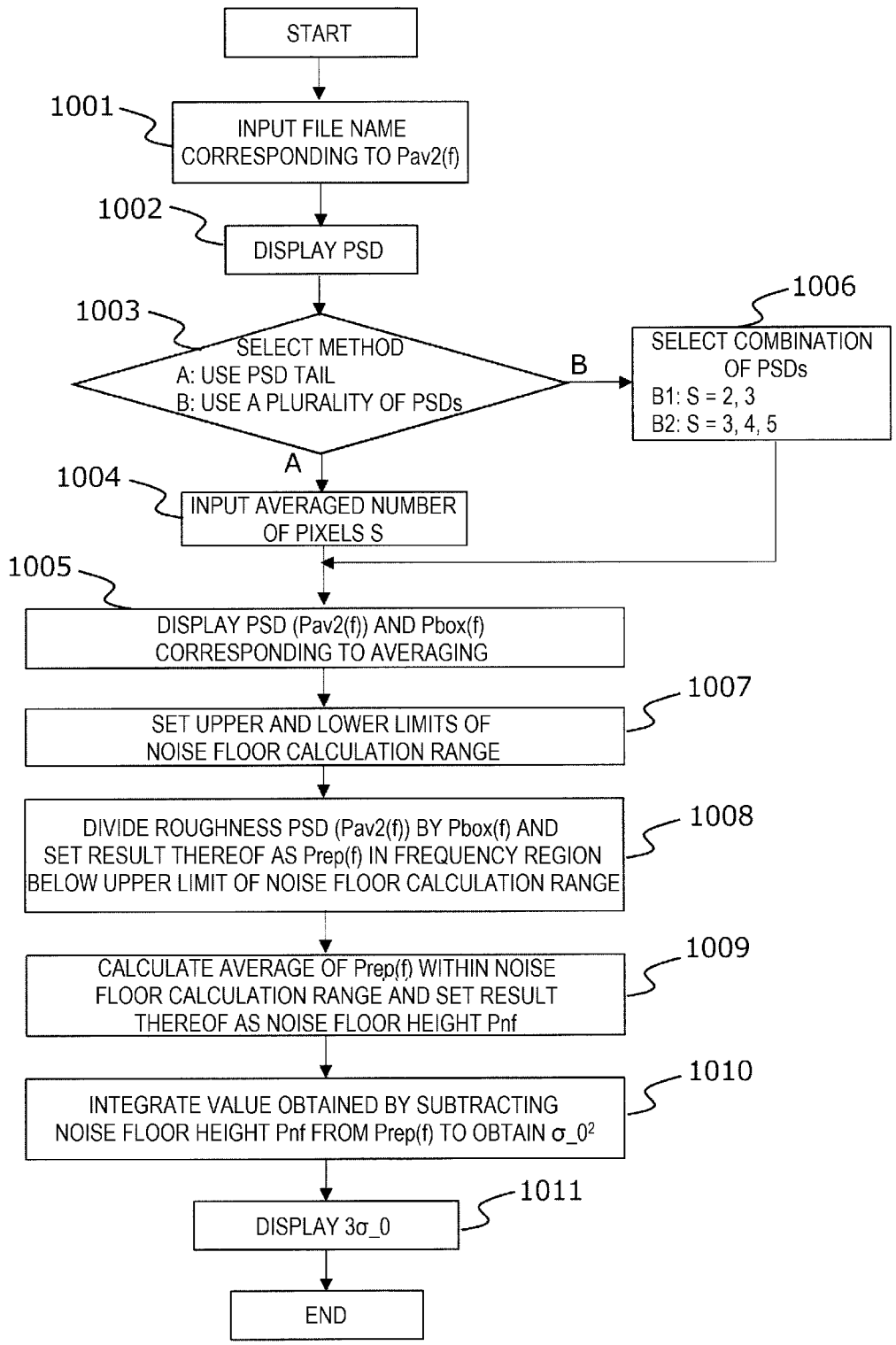

[FIG. 11]
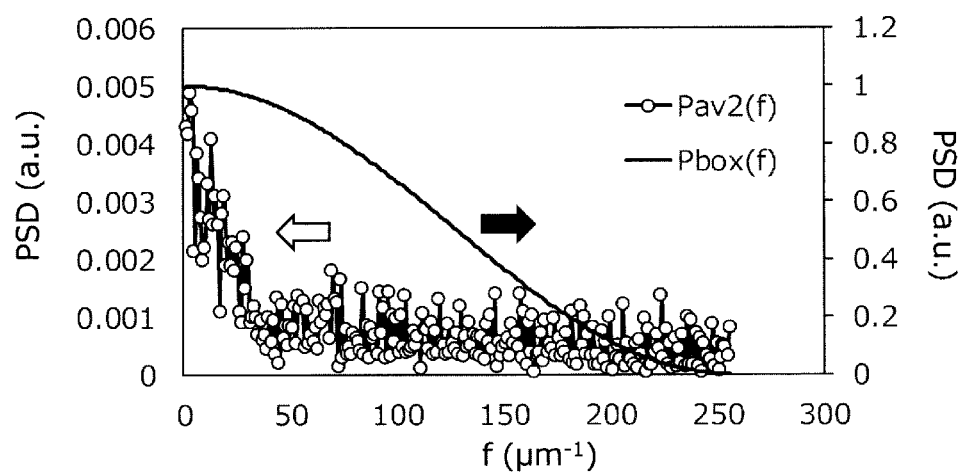

[FIG. 12]
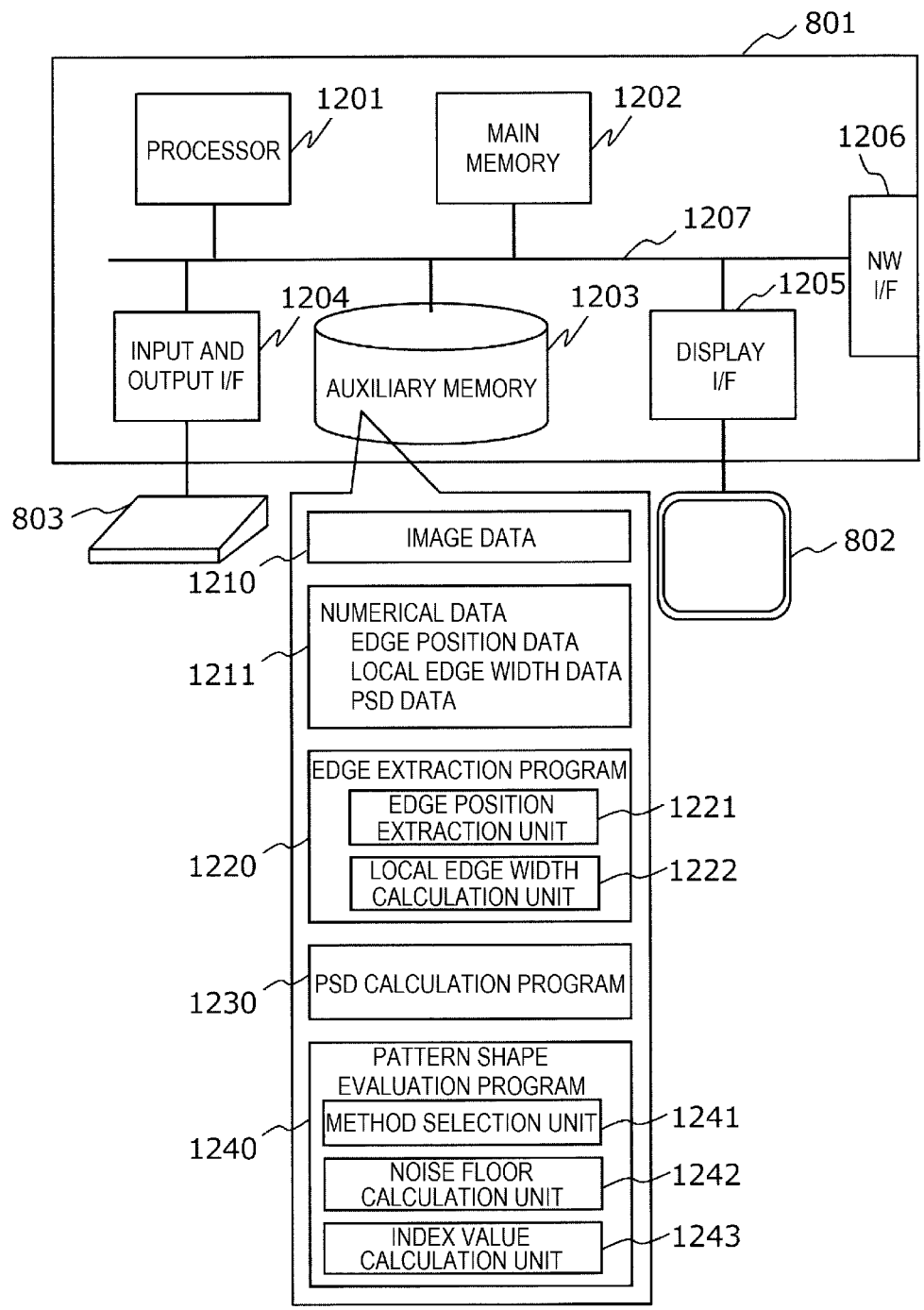

[FIG. 13]
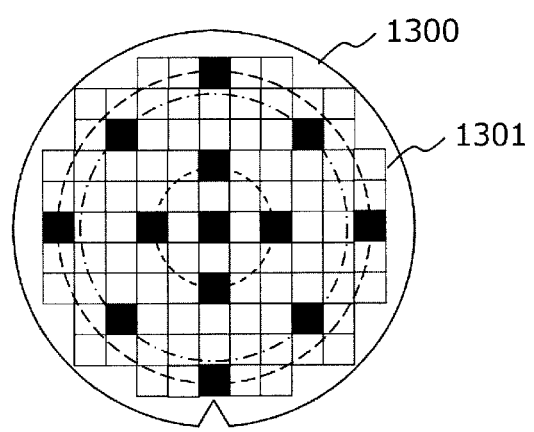

PATTERN SHAPE EVALUATION DEVICE, PATTERN SHAPE EVALUATION SYSTEM, AND PATTERN SHAPE EVALUATION METHOD

TECHNICAL FIELD

The present invention relates to a pattern shape evaluation device, a pattern shape evaluation system, and a pattern shape evaluation method.

BACKGROUND ART

In a manufacturing process of a miniaturized semiconductor device, a slight fluctuation in a pattern contour causes deterioration of device performance, and thus shape evaluation of the pattern contour is important. Above all, accurate evaluation of edge roughness of ultrafine lines that constitute a transistor or a wiring portion is necessary for management of the manufacturing process.

For evaluation of a fine pattern shape of a semiconductor, especially for evaluation of a local fluctuation such as the edge roughness, an electron microscope having a length measuring function, a critical dimension scanning electron microscope (CD-SEM), and a system that analyzes an image of the fine pattern are usually used. The CD-SEM captures a top-down image of a line pattern from above a semiconductor wafer, images an amount of secondary electrons emitted from a sample, and outputs the image. From this image, a discrete edge position of a pattern is calculated, and a distribution of an amount of deviation from an ideal straight line is obtained as the edge roughness. The edge roughness of the line pattern is particularly called line-edge roughness, and is often abbreviated as LER (line-edge roughness). As an LER index, it is common to use three times standard deviation 6 of a distribution of differences between an edge position extracted from the image and the ideal straight line. Further, both left and right edge positions of the line pattern are extracted, and three times the standard deviation of a local width distribution is obtained, which is called line width roughness (LWR). This may also be used as an index of roughness of the line pattern. The LWR also behaves in the same way as the LER, except when there is waviness in a line (see Patent Literature 1).

It is known that an index value of LER or LWR (in the present description, unless otherwise specified, both are abbreviated as LER for convenience) calculated from the image is affected by random noise contained in the image (see Non-Patent Literature 1). That is, simply obtaining the LER by extracting an edge of the line pattern from a CD-SEM image can only obtain a value that is a mixture of a fluctuation of the edge position of the pattern itself and a fluctuation of an apparent edge position due to the random noise in the image. This situation is shown by the following (Expression 1).

[Expression 1]

$$\sigma\_measured^2 = \sigma\_0^2 + \sigma\_error^2 \quad \text{(Expression 1)}$$

Here, $\sigma\_measured$ is ⅓ of a measured LER, $\sigma\_0$ is ⅓ of an LER when there is no noise (called true LER), and $\sigma\_error$ is an amount caused by noise.

When the measured LER ($3\sigma\_measured$) is used for semiconductor manufacturing process management and material evaluation, the measured value changes due to changes in noise generated in or around the CD-SEM itself even if the true LER is the same. Further, when extracting the LER from the CD-SEM image of patterns having the same shape but different materials, the measured value may or may not be easily affected by the random noise due to differences in charging or secondary electron efficiency of each material, and thus differences in the true LER cannot be seen. Therefore, there is a need to calculate the true LER ($3\sigma\_0$) by calculating the $\sigma\_error$ caused by this random noise by some methods and removing the $\sigma\_error$ from the simple measured LER.

A plurality of methods are proposed so far to meet this need. A first method shown in Non-Patent Literature 1 is a method in which the fluctuation of the edge position of the line pattern extracted from the CD-SEM image is regarded as a wave in a direction along the line and Fourier transformed, that is, a method of obtaining a power spectral density (hereinafter, referred to as PSD) of the LER and subtracting a height of a flat region (noise floor) appearing in a high frequency region. A second method shown in Non-Patent Literature 2 is a method of imaging the same portion twice and estimating the $\sigma\_error$ from differences therebetween. A third method shown in Patent Literature 2 is a method of performing a plurality of image processing on one imaging result (image) and estimating the $\sigma\_error$ from the processing result.

The first method has a problem that a capacity of the image is large since an image capable of calculating PSD up to a high frequency side, that is, an image having a large number of pixels, is required. Further, calculation time is also long since a Fourier transform is required. The second method requires that the exactly same portion be imaged twice, which has a problem that correction of spot misalignment or sample changes due to electron beam irradiation cause a large error. The third method is applicable to all images, but has a problem of an error due to fitting. In recent years, higher accuracy is required as the LER value itself becomes fairly small by efforts of materials or device vendors.

On the other hand, due to improved computer performance, even an image having a large number of pixels can be processed in a short time, and the calculation time required for the Fourier transform is no longer a problem. Against this background, the first method becomes a promising solution candidate in recent years. Therefore, the first method will be briefly described.

FIG. 1 shows a top-down image 102 in which a line pattern 101 shown as a cross-sectional view 103 is observed by a CD-SEM. The line pattern 101 extends in a Y direction. As shown in the cross-sectional view 103, the line pattern 101 has a central portion that is convex upward, and is, for example, a fine line pattern having a width of 20 nm or less. In the image 102, a place where the amount of secondary electrons emitted is large is shown in white, and a place where the amount of secondary electrons emitted is small is shown in black. Generally, a portion where the amount of secondary electrons emitted is large is near a side wall of the pattern (pattern contour when viewed from above), but when the line is thin, an entire line becomes bright. This is because bases of portions where the amount of secondary electrons emitted is large near side walls of both sides of the pattern overlap.

A length corresponding to one side of pixels constituting the image in the Y direction is set as $\Delta y$. A plot of an amount of secondary electron signals or gray scale of pixels along an X direction with a constant Y coordinate is called a signal profile. On each signal profile, a position corresponding to a left edge 104 of the line pattern is defined as $x\_i$. Here, i is a number of the signal profile, which corresponds to an i-th pixel in the Y direction. An obtained edge point (x_i, i) is linearly approximated, and the amount of deviation from an approximate straight line Δx_i is obtained at each Y coordinate (value of each i). This sequence {Δx_i|i=1, 2, . . . n} is called LER data. Since a fast Fourier transform is used, n is set to a power of 2.

Similarly, on each signal profile, positions corresponding to edges on both sides of the line pattern are defined, and a distance between the positions is defined as a width w_i of the line pattern. An average value is obtained for an obtained line width (w_i, i), and a difference Δw_i from the average value is obtained at each Y coordinate (value of each i). This sequence {Δw_i|i=1, 2, . . . n} is called LWR data.

FIG. 2 is a diagram in which the LER data (or LWR data) is fast Fourier transformed and the PSD is plotted against a spatial frequency f. The PSD obtained by the fast Fourier transform is symmetrical. In FIG. 2 and subsequent figures, only a left half is shown for the sake of simplicity when the PSD is shown. An integral of the PSD is equal to a variance value of the LER data, but when integrating, it should be noted that there is also data in a symmetric right half (not shown).

In the PSD of the LER data obtained in this way, if a pixel size Δy is sufficiently small, a flat region 201 appears in the high frequency region (the region 201 is called a noise floor region, and a magnitude of the PSD in the noise floor region is called a noise floor height). The noise floor region 201 is regarded as random noise that is white noise instead of original roughness due to a shape of the pattern, and a value obtained by integrating this value over an entire frequency region is defined as $\sigma\_error^2$. A remaining region 202 is the square of roughness $\sigma\_0$ derived from a pattern edge.

CITATION LIST

Patent Literature

PTL 1: JP-A-2014-240765
PTL 2: JP-A-2006-215020

Non-Patent Literature

NPL 1: "Determination of Optimal Parameters for CD-SEM Measurement of Line-Edge Roughness", Bunday, B. D., et al., Proceedings of SPIE Vol. 5375, p 515 (2004)
NPL 2: "Unbiased estimation of linewidth roughness", Villarrubia, J. S. and Bunday, B. D., Proceedings of SPIE Vol. 5752, p 480 (2005)

SUMMARY OF INVENTION

Technical Problem

When a signal-to-noise ratio (hereinafter, referred to as S/N ratio) of an image is low, the above method of calculating a noise floor height from a high frequency side of a PSD and subtracting the noise floor height from the PSD (hereinafter, referred to as noise floor subtraction method) may not be successful in calculating an LER. From this, it can be seen that a spot is fixed, imaging is performed while changing the number of times that a signal is integrated from a small value to a large value, and 3σ_0 is obtained from obtained images. FIG. 3 shows a signal integration number dependence of 3σ_measured obtained directly from LER data obtained from the images ("conventional direct method" in the figure) and 3σ_0 obtained by a conventional noise floor subtraction method in Non-Patent Document 1 ("conventional noise floor subtraction method" in the figure). Numerical values obtained for two line edges 1 and 2 are plotted. When a signal integration number is small, that is, when the S/N ratio is low, 3σ_measured is a significantly large value, and a graph of 3σ_0 is close to a constant value. However, even so, it can be seen that 3σ_0 becomes fairly small or large when the signal integration number is 2 or less.

When a resist pattern is observed or when a layer that is easily damaged by electron beam irradiation appears on a surface, there is a demand to analyze an image obtained by irradiating a small amount of electron beam having a low accelerating voltage, and it is required to obtain correct 3σ_0 from an image having a possibly lowest S/N ratio.

Solution to Problem

A pattern shape evaluation device configured to evaluate a shape of a line pattern formed on a sample according to one embodiment of the invention includes a processor; a memory; and an edge extraction program and a pattern shape evaluation program which are read into the memory and executed by the processor, in which the edge extraction program includes an edge position extraction unit configured to extract an edge position of the line pattern from a top-down image of the line pattern, the pattern shape evaluation program includes a noise floor calculation unit, a longitudinal direction of the line pattern in the top-down image is defined as a Y direction and a direction perpendicular to the Y direction is defined as an X direction, the edge position extraction unit obtains an averaged signal profile obtained by performing a moving average of S pixels (S is an integer greater than 1) in the Y direction on a signal profile showing a secondary electron signal amount distribution in the X direction with respect to a predetermined Y coordinate obtained from the top-down image and extracts the edge position of the line pattern based on the averaged signal profile, and the noise floor calculation unit calculates a noise floor height based on a first power spectral density of LER data or LWR data based on the edge position extracted by the edge position extraction unit and a second power spectral density of a rectangular window function corresponding to the moving average of the S pixels.

Advantageous Effect

It is possible to evaluate line-edge roughness or line width roughness, which is an index for quantitatively evaluating quality of devices or process conditions for forming a pattern from an image obtained by observing a substrate having a line shape, by preventing an influence of noise caused by a device or an environment.

Other problems and novel features will be apparent from description of the present description and accompanying drawings.

BRIEF DESCRIPTION OF DRAWINGS

FIG. 1 is an image (schematic diagram) obtained by observing a fine line pattern in a top-down view.

FIG. 2 is a power spectral density (schematic diagram) of LER/LWR of a line pattern.

FIG. 3 is a diagram showing a relation between a signal integration number and an LER value.

FIG. 4 is a diagram showing a noise floor subtraction method.

FIG. 5A is a diagram showing an edge position in a signal profile (without an averaging process).

FIG. 5B is a diagram showing an edge position in a signal profile (with an averaging process).

FIG. 6 is a normalized power spectral density of a rectangular window function.

FIG. 7 shows a power spectral density obtained by connecting normalized power spectral densities of multiple rectangular window functions.

FIG. 8 is a configuration diagram of a pattern shape evaluation system.

FIG. 9 is an example of extracting an edge position from a fine line pattern.

FIG. 10 is a flowchart for calculating LER/LWR.

FIG. 11 is a diagram showing a power spectral density of LER of a line pattern and a power spectral density of a rectangular window function together.

FIG. 12 is an example of a hardware configuration of a computer (pattern shape evaluation device).

FIG. 13 is an example of a wafer to be inspected.

DESCRIPTION OF EMBODIMENTS

A pattern evaluation method in the present embodiment will be described with reference to FIG. 4. The method is positioned as a new noise floor subtraction method having a wider range of application than a conventional noise floor subtraction method.

When obtaining $\sigma\_0^2$ in the conventional noise floor subtraction method, a secondary electron signal amount (usually treated as gray scale of pixels) distribution 401 is acquired first. Here, Y-axis is a direction parallel to a longitudinal direction of a line pattern. A portion having high signal strength represents an edge, and an edge position can be extracted from the secondary electron signal amount distribution in an X direction at each Y value. Position data 402 represents the edge position. A PSD 403 is obtained by regarding the position data 402 as a sequence of an X coordinate, calculating LER data, and obtaining the PSD by a Fourier transform. In a region of a spatial frequency f that can be regarded as a noise floor, an average value of the PSD is calculated as a noise floor height, the noise floor height is subtracted from the entire PSD, and a remaining integral value is the $\sigma\_0^2$, which is the above conventional noise floor subtraction method.

However, as described as a problem, when a contrast of an image is low and noise is large, the position data 402 extracted as the edge position from the secondary electron signal amount distribution 401 is unreliable. This is because, as will be described later, according to the method of extracting the position data 402 by the conventional noise floor subtraction method, a position unrelated to the edge of a pattern is often recognized as an edge position from an image having a low contrast and large noise. In the present embodiment, the PSD 403 is obtained by another route that improves recognition accuracy of the edge position.

In the new noise floor subtraction method, a secondary electron signal amount is averaged when the edge position is extracted. This is an operation of taking a moving average of a signal amount in a direction along a line (generally, a vertical direction of the image, that is, a Y direction in this case). That is, in order to obtain a signal profile of a certain Y coordinate, a total of S signal profiles of the Y coordinate itself and the vicinity thereof are averaged. This is equivalent to blurring image data (secondary electron signal amount distribution 401) by a rectangular window 404 for S pixels in the Y direction. As a result, the image data (secondary electron signal amount distribution 401) becomes an averaged secondary electron signal amount distribution 405. Position data 406 is obtained by extracting an edge position from the averaged secondary electron signal amount distribution 405. The edge position is calculated for Y coordinate values of all pixels (that is, all signal profiles). An averaging process makes edge roughness of the position data 406 smoother than that of the position data 402 without the averaging process. A PSD 407 is obtained from the position data 406. Since a substantial resolution is deteriorated by performing the averaging process, a magnitude of the PSD 407 on a high frequency side is smaller than that of the PSD 403. Further, aliasing also appears depending on a value of S.

Here, averaged position data 408 obtained by performing the same averaging operation in the Y direction to the position data 402 is virtually considered (as a noise floor subtraction method, such an averaging operation after extracting an edge position is not performed). A moving average operation is nothing but blurring the position data 402 by the rectangular window 404. Thus, the averaged position data 408 can be obtained by blurring the position data 402 by the rectangular window 404, which means that a PSD 410 of the averaged position data 408 is obtained by multiplying the PSD 403 of the position data 402 by a PSD 409 of the rectangular window 404. Therefore, the PSD 403 can be obtained by dividing the PSD 410 by the known PSD 409. This method itself is a common method for sharpening an image. In contrast, in the noise floor subtraction method in the present embodiment, effects of averaging at an image stage (present embodiment) and averaging after extracting the edge position (virtual example) are very close, but differences are used. Since the PSD 410 of the averaged position data 408 should be very close to the PSD 407 of the position data 406, the PSD 403 without averaging can be substantially reproduced by dividing the PSD 407, instead of the PSD 410, by the PSD 409. The PSD 409 of the rectangular window function is standardized so that the PSD becomes 1 when f→0.

Differences between the averaged position data 408 and the position data 406 will be described. FIG. 5A is an example of the secondary electron signal amount distribution 401, and it is assumed that there are adjacent signal profiles with Y=1, 2, and 3. A left side (region having low signal strength) is a space region, and a right side (region having high signal strength) is a line region. A common method of defining the edge position of the pattern on the signal profile is to use a difference between minimum and maximum values of a signal, that is, a position where strength is given to internally divide a height of the signal by a ratio designated by a user as an edge. FIG. 5A shows an example in which the ratio is 70%. A spike noise 501 is on the signal profile of Y=2. Since the noise is likely to occur in a region having a high secondary electron number yield originally, the spike noise is biased toward a line region having the high signal strength rather than the space region having the low signal strength. Therefore, when the edge position is obtained by the above definition, due to the presence of the noise, only the edge position extracted from the signal profile of Y=2 is the position of the spike noise 501, not the edge position of the pattern itself (black circles in the figure represent edge positions).

FIG. 5B shows the averaged secondary electron signal amount distribution 405 obtained by averaging the secondary electron signal amount distribution 401 with S=3. Due to the averaging process, the signal profile of Y=2 is gentler than the signal profile before averaging, and the edge positions of the three signal profiles are not as far apart as in FIG. 5A. That is, it is possible to avoid outputting a position irrelevant to an original edge position as an edge position due to the spike noise.

In the conventional noise floor subtraction method, it is assumed that an observed edge position consists of target edge position information and random noise only. However, in an image having a low image contrast and large noise, in fact, the observed edge position is a combination of the target edge position information and a variation around an target edge, as well as information on a location where the spike noise is generated unevenly in the line region, and the information on the original edge position is relatively little. Therefore, in such a case, the signal profile is averaged to reduce an influence of the spike noise. This is a feature of the new noise floor subtraction method.

The above procedure is represented by an expression (Expression 2) as follows. The PSD 403 obtained by obtaining the edge positions without averaging the image and Fourier transforming a sequence of the edge positions is defined as Porignal(f). Further, the PSD 410 obtained by Fourier transforming the sequence of the edge positions after performing an averaging operation is defined as Pav1(f). The PSD 407 obtained by obtaining the edge positions after averaging the signal profiles and then Fourier transforming the sequence of the edge positions is defined as Pav2(f). Further, the PSD 409 of the rectangular window function corresponding to the averaging operation is defined as Pbox(f)

[Expression 2]

$$Poriginal(f) \times Pbox(f) = Pav1(f) \cong Pav2(f) \quad \text{(Expression 2)}$$
$$\therefore Poriginal(f) \cong \frac{Pav2(f)}{Pbox(f)} \equiv Prep(f)$$

Here, Pav2(f)/Pbox(f), which is similar to Poriginal(f), is displayed as Prep(f) as a reproduced PSD, and is distinguished from Poriginal(f).

The Pbox(f), which is the PSD of the rectangular window function used for division, has a spatial frequency region in which a value is fairly small. As an example, FIG. 6 shows PSDs with S=2 (solid line) and S=3 (broken line). A unit of a horizontal axis frequency f is a reciprocal of a pixel size. For example, a PSD value when f=0.2 corresponds to power of a wave whose period is five times the length of one side of a pixel. FIG. 4 shows that PSD division is performed (when performing this operation, units on the horizontal axis are aligned in advance), but in a frequency region where the PSD value is small, an error becomes large because small values are divided.

There are two methods to avoid this error. One is a method of using only a region having a relatively large value in the high frequency region of the PSD, and the other is a method of utilizing an aliasing region. Here, these methods will be referred to as method A and method B, respectively.

Specifically, in the method A, a cutoff frequency is defined for the PSD 409, and the PSD 403 is reproduced by using only the frequency region below the cutoff frequency. For example, a point where the PSD value of the PSD 409 is 20% of a maximum value is defined as cutoff. On the other hand, in the method B, the Pav2(f) and the Pbox(f) are created by connecting the PSDs obtained from different S. As an example, FIG. 7 shows a graph 701 (solid line) in which the PSDs of rectangular windows with S=2 and S=3 are combined. As shown in FIG. 6, in the low frequency region, the PSD value of S=2 is larger than the PSD value of S=3, but in the high frequency region, the PSD value of S=3 becomes larger than the PSD value of S=2. The PSD 701 is obtained by selecting and connecting each point having a larger PSD value with respect to the spatial frequency f.

In a case where the method B is used, when the averaged image data 405 is calculated from the image data 401, two types of averaging of S=2 and S=3 are performed. The position data and the PSD are obtained from each result, and two PSDs are connected to obtain the PSD 407. The PSD 407 is divided by using the PSD 701 of FIG. 7 as the PSD (PSD 409) of the rectangular window function.

In the same way, PSDs with S=3, S=4 and S=5 can be combined. The Pbox(f) in a case of a combination of S=3, 4, and 5 is shown by a PSD 702 (broken line) in FIG. 7. A right end on the high frequency side overlaps with the PSD 701 because a PSD value of S=3 is used. When the edge position cannot be detected correctly even after averaging with S=2, a PSD constituted by PSDs when S is 3 or more may be used.

Hereinafter, proper use of the method A and the method B will be described. When the PSD 407 can be detected up to a relatively high frequency region, that is, when the pixel size is small and an edge detection interval is set to be small, the method A in which the PSD value used for division does not decrease is suitable. However, when the pixel size is large and the edge detection interval is relatively large, there are originally few data points on the noise floor. In such a case, the method B may be used. The method B tends to have a larger error than the method A since division is performed by a small PSD value.

FIG. 8 shows a pattern shape evaluation system that evaluates and inspects such a line pattern. The pattern shape evaluation system includes a computer (pattern shape evaluation device) 801 equipped with a program that extracts and outputs an edge position from a line pattern image and a program that Fourier transforms data of the edge position or a local line width of the present embodiment and outputs an LER value or LWR value from which a noise component is removed, a monitor 802 connected to the computer 801, an input device 803, a storage device 804 that stores a CD-SEM image and other data, an electron microscope 805 that observes a fine pattern, a computer (control device) 806 that controls the electron microscope and stores the obtained image, etc., a monitor 807 that displays a state or input and output states of the computer 806, and an input device 808.

A hardware configuration example of the computer (pattern shape evaluation device) 801 is shown in FIG. 12. The computer 801 includes a processor 1201, a main memory 1202, an auxiliary memory 1203, an input and output interface 1204, a display interface 1205, and a network interface 1206, which are connected by a bus 1207. The input and output interface 1204 is connected to the input device 803, and the display interface 1205 is connected to the monitor 802, thereby implementing a GUI with an operator. Further, in a process of evaluation and inspection, the CD-SEM image and an evaluation result as described later are displayed. The network interface 1206 is an interface for connection to a network, and the storage device 804 and the computer (control device) 806 are connected to the network via this interface. The auxiliary memory 1203 usually includes a non-volatile memory such as an HDD, a ROM, or a flash memory, and stores a program executed by the computer 801 and data to be processed by the program. The data to be processed by the program is fetched from the storage device 804. The main memory 1202 includes a RAM, and temporarily stores a program, data necessary for executing the program, and the like according to an instruction from the processor 1201. The processor 1201 executes a program loaded from the auxiliary memory 1203 to the main memory 1302.

The auxiliary memory 1203 stores image data 1210 which includes a pattern to be evaluated and is read from the storage device 804, numerical data 1211 which is necessary for an evaluation process and is stored in advance or calculated by executing a program, other data, an edge extraction program 1220, a PSD calculation program 1230, a pattern shape evaluation program 1240, and other programs. The edge extraction program 1220 includes an edge position extraction unit 1221 and a local edge width calculation unit 1222 as main units thereof. The pattern shape evaluation program 1240 includes a method selection unit 1241, a noise floor calculation unit 1242, and an index value calculation unit 1243 as main units thereof. The pattern shape evaluation program 1240 is a program that executes a flowchart of FIG. 10 to be described later. Specifically, the method selection unit 1241 executes steps 1001 to 1006 of the flowchart, the noise floor calculation unit 1242 executes steps 1007 to 1009, and the index value calculation unit 1243 executes steps 1010 to 1011.

First Embodiment

In the first embodiment, an example of monitoring a process by using an LER of a fine line pattern will be described. When calculating the LER, by using the new noise floor subtraction method described above to calculate the LER value that is not affected by noise, it is possible to detect a slight change in a process device and prevent a decrease in yield without being affected by a surrounding environment. For example, in a region of 1 µm near a center of a line pattern having a length of 1.5 µm, which is included in a device that will be continuously manufactured for a long period of time, an LER average value of a left edge is measured at several points for all processed silicon wafers, and the value is monitored. By applying the new noise floor subtraction method, environmental noise is eliminated as much as possible, and by measuring the LER of the pattern itself, appropriate monitoring can be performed.

First, an inspection specification is determined. All power of the pattern shape evaluation system shown in FIG. 8 is turned on, a typical silicon wafer having a pattern to be inspected is inserted into the electron microscope 805 by operation of the input device 808, and an image obtained by observation is stored in the storage device 804. Subsequently, the computer 801 is allowed to run the edge extraction program 1220 for extracting edge information from the image by the operation of the input device 803, and the image stored in the storage device 804 is called and analyzed.

A line pattern to be evaluated is parallel to a side in the vertical direction (hereinafter, defined as the Y direction) of the image in the image. An example of the image is an image 102 shown in FIG. 1, and a white portion in the image is the line pattern. This figure is a simplification and in fact, there are shades in the white portion and the spike noise (data points having fairly high signal strength) in a point painted in black.

The operator defines a position where the average strength of the highest and lowest strengths of the signal is obtained on the signal profile near the left edge as the edge position. The edge position extraction unit 1221 of the edge extraction program 1220 extracts the edge position from the image (signal profile) based on the definition of the operator. At this time, the operator can designate an averaged number of pixels (S: S is an integer larger than 1), and when the averaged number of pixels (S) is designated, the edge position is extracted from the moving average of S signal profiles in a vicinity.

Although the edge is extracted along the line without processing the image (signal), a phenomenon is observed in which the edge position appears at a position that is abnormally distant from a position that considered appropriate as an original position. This means that the position of the spike noise is detected as the edge position because the noise is large. It is found that such a far-off edge position is almost eliminated by performing the averaging process for two signals (S=2). This situation is shown in FIG. 9. This is a part of an extracted edge position. Black circles connected by the solid line indicate the edge position when no averaging process is performed, and quadrangles connected by the broken line indicate the edge position when the averaging process is performed. The edge position extracted without the averaging process is not distributed around the edge position extracted after the averaging process, but is detected at a far-off position and on the right side (line region). On the other hand, the edge position extracted by the averaging process appears to be evenly distributed on the left and right as far as visually confirmed, although there are variations. In this case, the operator applies the above new noise floor subtraction method to a monitoring inspection specification instead of the conventional noise floor subtraction method, and decides to apply the method A because it can be determined that the averaged number of pixels (S) 2 is sufficient for averaging.

After determining the inspection specification of applying the method A at S=2, in monitoring, the operator inserts the wafer to be inspected into the electron microscope 805, moves a field of view to a region having a desired pattern in a chip, and captures and stores the image. The field of view is moved to a region in the same chip where the same pattern exists in the vicinity of the previously captured pattern to capture and store the image again. This operation is repeated to store a total of five images in the storage device 804. Next, the edge position extraction unit 1221 of the edge extraction program of the computer 801 averages a pattern image to be inspected with the averaged number of pixels (S) 2, then extracts the edge position, and stores the edge position as the numerical data 1211.

Next, the PSD calculation program 1230 obtains the LER data from saved edge position data and performs Fourier transform to calculate the PSD. A length of an edge to be analyzed is 1 µm, which corresponds to 512 pixels on a screen. At this time, a fundamental frequency of a PSD is 1 $\mu m^{-1}$. This operation is performed on the five images to obtain five pieces of PSD data. These PSDs are averaged, and information on original five images (information on an imaging date, an imaged wafer, a pattern position, etc.) and information on the averaged number of pixels (in this case, 2 is used) are specified and stored as a file in the storage device 804. This corresponds to the Pav2(f) in (Expression 2).

Next, from the stored Pav2(f), the LER value that suppresses noise information is calculated as follows. First, the input device 803 is operated to launch the pattern shape evaluation program 1240 for removing a noise-causing component from the PSD of the LER to obtain a true LER. FIG. 10 shows a flow in which the LER is calculated by this program and an operation of the operator.

First, the operator designates the PSD of an LER to be inspected from the input device 803 (step 1001). Specifically, a file name of the Pav2(f) once stored in the storage device 804 is designated. Accordingly, PSD data is called from the storage device 804 to the computer 801, and at the same time, a graph of the Pav2(f) is displayed on the monitor 802 (step 1002).

Next, an operation of estimating the PSD when it is not averaged from the PSD obtained from an averaged image is performed. As described above, there is the method A of using a tail of the PSD of the rectangular window function subjected to the averaging, and the method B of connecting a plurality of PSD and using the aliasing region. The operator selects either method A or method B (step 1003). In the present embodiment, the operator selects the method A according to the determined specification. Subsequently, the operator designates the averaged number of pixels (S) as "2" from the input device 803 (step 1004). The program of the computer 801 internally holds PSD data corresponding to rectangular windows having various S values as a function of the spatial frequency f (Pbox(f)). The program automatically proceeds to step 1005, and the Pbox(f) having the averaged number of pixels (S)=2 is displayed in a superimposed manner on the Pav2(f). This situation is shown in FIG. 11.

Next, upper and lower frequency limits for determining a noise floor region are set (step 1007). The lowest frequency at which the noise floor appears is a frequency at which it is considered that the device cannot detect higher spatial frequency components and is a value determined by a state of the device. Since the operator requests in advance that the spatial frequency be about 100 $\mu m^{-1}$ from properties of the device, the operator inputs this value. On the other hand, from the graph shown in FIG. 11, it can be seen that a value of the Pbox(f) becomes equal to or less than 0.2 in the vicinity of f=175 $\mu m^{-1}$, and therefore, an upper limit is determined to be 175 and is input. In response to this input, the program automatically proceeds to step 1008, in which Prep(f) is calculated by dividing the Pav2(f) by the Pbox(f) in a range of f=1 to 175 $\mu m^{-1}$, and values of Prep(f) in a range of f=100 to 175 $\mu m^{-1}$ are averaged and then are taken as a noise floor height Pnf (step 1009).

Subsequently, the program integrates a value of Prep(f)−Pnf in a range of f=1 to 100 $\mu m^{-1}$, and multiplies the value by 2 (step 1010), and this value corresponds to the $\sigma\_0^2$. A reason for doubling is that, as described above, a PSD graph symmetrical with a shown PSD graph exists on the high frequency side. A value obtained by taking a square root of the value obtained in step 1010 and then tripling is displayed on the monitor 802 (step 1011).

By the above monitoring, it is possible to prevent influence of an environmental fluctuation and obtain changes of the true LER with high reliability. By performing a fine adjustment of process parameters based on a long-term change of the LER obtained by continuing such monitoring, it is possible to prevent a decrease in the yield in a semiconductor manufacturing line.

Second Embodiment

In the second embodiment, an example will be described in which an LWR of a line pattern formed in a lithography process and made of a resist having a length of about 1.5 $\mu m$ is evaluated and a semiconductor device manufacturing line is monitored. A length of a line to be analyzed is 1 $\mu m$ as in the first embodiment, which corresponds to 512 pixels on the screen.

When a resist pattern is observed with an electron microscope, it is necessary to reduce the signal integration number in order to minimize damage caused by electron beam irradiation. For this reason, the noise level of an image is higher than that of the first embodiment. Therefore, even if the averaged number of pixels S is set to 2 and the image is averaged, there are points that deviate significantly from an edge point sequence. Accordingly, the operator determines that it is necessary to select 3 or more as the value of S as the inspection specification and takes the method B.

The operator creates the PSD of the LWR corresponding to the Pav2(f) in the following procedure. First, the wafer to be inspected is inserted into the electron microscope 805, the field of view is moved to the region having the desired pattern in the chip, and an image is captured and stored. The field of view is moved to the region in the same chip where the same pattern exists in the vicinity of the previously captured pattern to capture and store the image again. This operation is repeated to store a total of five images in the storage device 804. Next, the edge position extraction unit 1221 of the edge extraction program 1220 extracts left and right edge positions of the pattern from the edge image, and the local edge width calculation unit 1222 calculates the local line width by taking a difference between x coordinates of the left and right edge positions of the pattern. One pattern image to be inspected is averaged by the averaged number of pixels (S) 3, 4, and 5, and then a sequence of local line widths corresponding to respective S values is stored as a data set. The averaging is performed on the total of five images captured in a close region, and 5 sets of local line width data of S=3, 4, and 5 are created.

Next, the PSD calculation program 1230 Fourier transforms these local line width data to calculate the PSD. Five pieces of PSD data can be obtained with respect to one S value, and therefore, these PSDs are averaged, and the information on the original five images (information on an imaging date, an imaged wafer, a pattern position, etc.) and the information on the averaged number of pixels S (in this case, any of 3, 4 and 5 is used) are specified and stored as a file in the storage device 804. At this stage, since there are three PSDs of S=3, 4, and 5, these PSDs are connected to make one PSD. The PSD (Pbox(f)) that combines the PSDs of the rectangular window functions corresponding to the averaged number of pixels S=3, 4, and 5 is as shown by the broken line in FIG. 7. This PSD has the highest intensity among the three PSDs corresponding to S=3, 4, and 5 with respect to the spatial frequency f. When the number of the PSD data is 512, this PSD becomes a PSD of S=3 from frequency numbers 1 to 139, a PSD of S=5 from frequency numbers 140 to 163, a PSD of S=4 from frequency numbers 164 to 210, and a PSD of S=3 from frequency numbers 211 to 256. The PSD value of frequency numbers 257 or more is an inverted PSD value from frequency numbers 1 to 256.

The local line width (LWR) data is also connected according to the S value of the PSD (Pbox(f)) at each spatial frequency. In this case, Pav2(f) is obtained by connecting the frequency numbers 1 to 139 by the PSD of S=3, the frequency numbers 140 to 163 by the PSD of S=5, the frequency numbers 164 to 210 by the PSD of S=4, and the frequency numbers 211 to 256 by the PSD of S=3, and is stored in the storage device 804.

From the PSD of the LWR (=Pav2 (f)) created in this way, the LWR value that suppresses the noise information is calculated as follows. First, the input device 803 is operated to launch the pattern shape evaluation program 1240 for removing the noise-causing component from the PSD of the LWR to obtain a true LWR. The flow in which the LER/

LWR is calculated by this program and the operation of the operator is shown in FIG. 10 as in the first embodiment.

Overlapping descriptions will be omitted for the same steps as in the first embodiment. In the present embodiment, the operator selects the method B in step 1003 according to the determined specification. In this case, the program proceeds to step 1006, and B2 is selected as a combination of the averaged number of pixels (S). The computer 801 holds the PSD data as the numerical data 1211, which is a combination of the PSDs corresponding to the rectangular windows having various S values, as a function of the spatial frequency f (Pbox(f)). For example, the computer 801 holds not only a PSD (B2) which is a combination of S=3, 4, and 5 but also a PSD (B1) which is a combination of S=2 and 3 in the present embodiment. Thereafter, the program automatically proceeds to step 1005.

In step 1007, the upper and lower frequency limits that determine a noise floor calculation region are set. The lowest frequency is set in the same manner as in the first embodiment, while an upper frequency limit is not set. This is because the method B uses data in an entire frequency band. Therefore, in step 1008, the Pav2(f) is divided by the Pbox(f) in a left half region of the entire frequency band to obtain the Prep(f), and in step 1009, values of Prep(f) in a range where f is 100 μm$^{-1}$ or more are averaged and then are taken as the noise floor height Pnf in the left half region of the entire frequency band. Step 1010 and subsequent steps are the same as in the first embodiment.

By the above monitoring, it is possible to prevent the influence of the environmental fluctuation and obtain changes of the true LWR with high reliability. It is assumed that such monitoring is performed on a wafer 1300 on which chips 1301 are formed as shown in FIG. 13. An inspection for calculating 3σ_0 as an index value of the LWR described above is performed, for example, on chips at positions shown in black in FIG. 13. All of created wafers are put into the pattern shape evaluation system, five line patterns near a center of each chip to be inspected are imaged, and the value of the 3σ_0 is calculated from the line patterns. As a result, 13 LWR index values (=the number of chips to be inspected) are calculated for each wafer.

As shown in FIG. 13, the chips to be inspected have four types of distances from a center of the wafer. There is one chip in the center of the wafer, four chips closest to the center, four chips second-closest to the center, and four chips farthest from the center (the distance from the center is shown by concentric circles in FIG. 13). Average LWR values of these four groups are set to sig1, sig2, sig3, and sig4, respectively, and a tendency thereof is monitored by the 3σ_0 calculated over a long period of time. In the present embodiment, since the influence of noise can be significantly prevented, it is possible to monitor a long-term change of the LWR index value, and a difference between a long-term change in a central portion of the wafer and a long-term change in a peripheral portion of the wafer. It is difficult to find a tendency for such a change due to the influence of noise by a conventional method. Further, by performing maintenance of a lithography device based on the long-term change monitored as described above, it is possible to reduce the number of wafers to be reworked in the inspection after etching, thereby reducing costs.

REFERENCE SIGN LIST

101 line pattern
102 CD-SEM image
103 line pattern (cross-sectional view)
104 edge
801 computer (pattern shape evaluation device)
802 monitor
803 input device
804 storage device
805 electron microscope
806 computer (control device)
807 monitor
808 input device
1201 processor
1202 main memory
1203 auxiliary memory
1204 input and output interface
1205 display interface
1206 network interface
1207 bus
1210 image data
1211 numerical data
1220 edge extraction program
1221 edge position extraction unit
1222 local edge width calculation unit
1230 PSD calculation program
1240 pattern shape evaluation program
1241 method selection unit
1242 noise floor calculation unit
1243 index value calculation unit
1300 wafer
1301 chip

The invention claimed is:

1. A pattern shape evaluation device configured to evaluate a shape of a line pattern formed on a sample, the pattern shape evaluation device comprising:

a processor;

a memory; and an edge extraction program and a pattern shape evaluation program which are read into the memory and executed by the processor, wherein the edge extraction program includes an edge position extraction unit configured to extract an edge position of the line pattern from a top-down image of the line pattern, the pattern shape evaluation program includes a noise floor calculation unit, a longitudinal direction of the line pattern in the top-down image is defined as a Y direction and a direction perpendicular to the longitudinal direction is defined as an X direction, the edge position extraction unit obtains an averaged signal profile obtained by performing a moving average of S pixels (S is an integer greater than 1) in the Y direction on a signal profile showing a secondary electron signal amount distribution in the X direction with respect to a predetermined Y coordinate obtained from the top-down image, and extracts the edge position of the line pattern based on the averaged signal profile, and the noise floor calculation unit calculates a noise floor height based on a first power spectral density of LER data or LWR data based on the edge position extracted by the edge position extraction unit and a second power spectral density of a rectangular window function corresponding to the moving average of the S pixels.

2. The pattern shape evaluation device according to claim 1, wherein the signal profile is a distribution of gray scale of pixels in the X direction with respect to the predetermined Y coordinate in the top-down image.

3. The pattern shape evaluation device according to claim 1, wherein
the LER data obtains an approximate straight line that approximates an edge of the line pattern, and is a set of distances between the edge position of the line pattern at each Y coordinate and the approximate straight line, and
the LWR data calculates an average value of local widths of the line pattern, and is a set of differences between a local width of the line pattern at each Y coordinate and the average value.

4. The pattern shape evaluation device according to claim 1, wherein
the pattern shape evaluation program includes an index value calculation unit, and
the index value calculation unit calculates an index value of a shape of the line pattern by integrating a power spectral density obtained by subtracting the noise floor height from a third power spectral density obtained by dividing the first power spectral density by the second power spectral density.

5. The pattern shape evaluation device according to claim 1, wherein
the pattern shape evaluation program includes a method selection unit, and
the method selection unit selects one of a first method using one S value or a second method using a plurality of S values.

6. The pattern shape evaluation device according to claim 5, wherein
when the method selection unit selects the first method, the noise floor calculation unit defines a noise floor region in a spatial frequency region in which a magnitude of the second power spectral density does not become equal to or less than a predetermined value with respect to a third power spectral density obtained by dividing the first power spectral density by the second power spectral density, and sets an average value of the third power spectral density in the noise floor region as a noise floor height.

7. The pattern shape evaluation device according to claim 5, wherein
when the method selection unit selects the second method, the edge position extraction unit obtains the averaged signal profile for each of the plurality of S values, and extracts the edge position of the line pattern based on each of a plurality of averaged signal profiles,
the second power spectral density is a power spectral density in which power spectral densities of a plurality of rectangular window functions corresponding to a moving average of the S pixels with respect to a plurality of S values are connected so that a value in each spatial frequency becomes a maximum value of the power spectral densities of the plurality of rectangular window functions, and
the first power spectral density is a power spectral density in which power spectral densities of a plurality of LER data or LWR data based on the edge position extracted by the edge position extraction unit with respect to the plurality of S values are connected in accordance with a value of S of the second power spectral density at each spatial frequency.

8. The pattern shape evaluation device according to claim 7, wherein
the noise floor calculation unit defines a noise floor region with respect to a third power spectral density obtained by dividing the first power spectral density by the second power spectral density, and sets an average value of the third power spectral density in the noise floor region as a noise floor height.

9. The pattern shape evaluation device according to claim 7, wherein
2 and 3, or 3, 4, and 5 are used as the plurality of S values.

10. A pattern shape evaluation system comprising:
an electron microscope configured to image a top-down image;
a storage device configured to store the top-down image captured by the electron microscope; and
a pattern shape evaluation device according to claim 1, the pattern shape evaluation device being connected to the storage device, wherein
the pattern shape evaluation device reads the top-down image stored in the storage device to evaluate a shape of the line pattern captured in the top-down image.

11. A pattern shape evaluation method for evaluating a shape of a line pattern formed on a sample with a pattern shape evaluation device by using a top-down image of the line pattern, the method comprising:
defining a longitudinal direction of the line pattern as a Y direction and a direction perpendicular to the longitudinal direction as an X direction in the top-down image;
extracting an edge position of the line pattern from the top-down image;
obtaining an averaged signal profile obtained by performing a moving average of S pixels (S is an integer greater than 1) in the Y direction on a signal profile showing a secondary electron signal amount distribution in the X direction with respect to a predetermined Y coordinate obtained from the top-down image, and extracting the edge position of the line pattern based on the averaged signal profile; and
calculating a noise floor height based on a first power spectral density of LER data or LWR data based on the edge position of the extracted line pattern and a second power spectral density of a rectangular window function corresponding to the moving average of the S pixels.

12. The pattern shape evaluation method according to claim 11, wherein
an index value of a shape of the line pattern is calculated by integrating a power spectral density obtained by subtracting the noise floor height from a third power spectral density obtained by dividing the first power spectral density by the second power spectral density.

13. The pattern shape evaluation method according to claim 11, wherein
one of a first method using one S value and a second method using a plurality of S values is selectable.

14. The pattern shape evaluation method according to claim 13, wherein
when the first method is selected, a noise floor region is defined in a spatial frequency region in which a magnitude of the second power spectral density does not become equal to or less than a predetermined value with respect to a third power spectral density obtained by dividing the first power spectral density by the second power spectral density, and an average value of the third power spectral density in the noise floor region is set as a noise floor height.

15. The pattern shape evaluation method according to claim 13, wherein
when the second method is selected, the averaged signal profile for each of the plurality of S values is obtained, and an edge position of the line pattern is extracted based on each of a plurality of averaged signal profiles, the second power spectral density is a power spectral density in which power spectral densities of a plurality of rectangular window functions corresponding to a moving average of the S pixels with respect to a plurality of S values are connected so that a value in each spatial frequency becomes a maximum value of the power spectral densities of the plurality of rectangular window functions, and the first power spectral density is a power spectral density in which power spectral densities of a plurality of LER data or LWR data based on the edge position of the extracted line pattern with respect to the plurality of S values are connected in accordance with a value of S of the second power spectral density at each spatial frequency.

16. The pattern shape evaluation method according to claim 15, wherein a noise floor region is defined with respect to a third power spectral density obtained by dividing the first power spectral density by the second power spectral density, and an average value of the third power spectral density in the noise floor region is set as a noise floor height.

* * * * *